US007473617B2

(12) United States Patent
Momoi et al.

(10) Patent No.: US 7,473,617 B2
(45) Date of Patent: Jan. 6, 2009

(54) INTEGRATED CIRCUIT CHIP MANUFACTURING METHOD AND SEMICONDUCTOR DEVICE

(75) Inventors: Kazutaka Momoi, Hiratsuka (JP); Nobuhiko Sato, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 272 days.

(21) Appl. No.: 11/149,145

(22) Filed: Jun. 10, 2005

(65) Prior Publication Data

US 2005/0280119 A1  Dec. 22, 2005

(30) Foreign Application Priority Data

Jun. 22, 2004  (JP)  ............... 2004-183961

(51) Int. Cl.
*H01L 21/30* (2006.01)
(52) U.S. Cl. .................. 438/458; 438/977; 438/459; 438/464
(58) Field of Classification Search .......... 438/110, 438/113, 115, 122, 458, 116, 459, 460, 631, 438/977, 464; 257/620, 625
See application file for complete search history.

(56) References Cited

U.S. PATENT DOCUMENTS

| 6,461,889 | B1 | 10/2002 | Samoto | 438/105 |
| 6,638,835 | B2 | 10/2003 | Roberds et al. | 438/458 |
| 6,774,010 | B2 | 8/2004 | Chu et al. | 438/458 |
| 2002/0100941 | A1 | 8/2002 | Yonehara et al. | 257/359 |
| 2002/0102758 | A1* | 8/2002 | Yonehara et al. | 438/30 |
| 2005/0202595 | A1 | 9/2005 | Yonehara et al. | 438/110 |

FOREIGN PATENT DOCUMENTS

| JP | 2000-58562 | 2/2000 |
| JP | 2002-231909 | 8/2002 |
| JP | 2003-323132 | 11/2003 |
| WO | PCT/JP2004/018981 | 12/2004 |
| WO | PCT/JP2004/018982 | 12/2004 |

\* cited by examiner

*Primary Examiner*—M. Wilczewski
*Assistant Examiner*—Sonya D McCall Shepard
(74) *Attorney, Agent, or Firm*—Fitzpatrick, Cella, Harper & Scinto

(57) ABSTRACT

This invention moderates the difficulty in chip formation or packaging which accompanies thinning of a semiconductor region where an integrated circuit is formed. An integrated circuit chip manufacturing method includes a first bonding step of bonding a first support member to a first surface of a semiconductor substrate which has the first surface and a second surface and has a semiconductor region including an integrated circuit on a first surface side thereof, a thinning step of removing a second surface-side portion of the semiconductor substrate bonded to the first support member to leave the semiconductor region, thereby thinning the semiconductor substrate, a second bonding step of bonding a second support member to the second surface side of the thinned semiconductor substrate, and a chip forming step of forming chips by cutting the semiconductor region.

16 Claims, 2 Drawing Sheets

INTEGRATED CIRCUIT CHIP MANUFACTURING METHOD AND SEMICONDUCTOR DEVICE

FIELD OF THE INVENTION

The present invention relates to an integrated circuit chip manufacturing method and semiconductor device.

BACKGROUND OF THE INVENTION

In recent years, a technique which thinks a semiconductor device attracts attention. According to the technique disclosed in patent reference 1, a protective film, protection insulating layer, and thin film layer are sequentially formed on the first substrate. The second substrate is adhered to the thin film layer with an adhesive. After that, the first substrate is removed by etching. The protection film is further removed to expose the protection insulating layer. A protection substrate is adhered to the protection insulating layer with an adhesive. After that, flexible cables are connected to the electrode portions of the thin film layer to manufacture an active matrix type organic electroluminescence display. Patent reference 1 is aimed at manufacturing a large-area thin film layer which is to be used as a display, and is not aimed at forming chips from a panel obtained by adhering a protective substrate.

According to the technique disclosed in patent reference 2, a semiconductor device is formed on a semi-insulating GaAs substrate by molecular beam epitaxy. The semiconductor device is separated by epitaxial lift-off from the substrate on which it is formed, and placed on a diamond substrate having a high thermal conductivity. However, patent reference 2 does not disclose forming chips from the semiconductor device placed on the diamond substrate.

According to the technique disclosed in patent reference 3, a semiconductor film having a semiconductor device is formed on a separation layer to form a substrate. The substrate is adhered to a support member. The resultant member is divided by using the separation layer. After that, the semiconductor film is formed into chips.

Patent Reference 1:
  Japanese Patent Laid-Open No. 2003-323132

Patent Reference 2:
  Japanese Patent Laid-Open No. 2000-58562

Patent Reference 3:
  Japanese Patent Laid-Open No. 2002-231909

In the viewpoint of improving the flexibility, enabling multilayer formation, and increasing heat radiation, a demand has arisen for thinning a semiconductor device. Thinning of the semiconductor device can lead to damages of the semiconductor device during dicing, and make it difficult to hold a chip during die bonding.

SUMMARY OF THE INVENTION

The present invention has been made on the recognition of the above problems, and has as its object to moderate the difficulty in chip formation or packaging which accompanies thinning of a semiconductor region where an integrated circuit is formed and, more particularly, facilitate dicing, die bonding, and the like.

According to the first aspect of the present invention, there is provided an integrated circuit chip manufacturing method comprising a first bonding step of bonding a first support member to a first surface of a semiconductor substrate which has the first surface and a second surface and has a semiconductor region including an integrated circuit on a first surface side thereof, a thinning step of thinning the semiconductor substrate by removing a second surface-side portion of the semiconductor substrate bonded to the first support member such that the semiconductor region is left, a second bonding step of bonding a second support member to the second surface side of the thinned semiconductor substrate, and a chip forming step of forming chips by cutting the semiconductor region.

According to a preferred embodiment of the present invention, the chip forming step can be performed after the second bonding step.

The manufacturing method preferably further comprises, after the chip forming step, a removing step of removing the first support member from the semiconductor region which has been formed into the chips. In the chip forming step, the semiconductor region may be cut together with the second support member to form chips, or the semiconductor region may be cut together with the first and second support members to form chips.

Alternatively, the manufacturing method may further comprise, after the second bonding step and before the chip forming step, a step of removing the first support member from a bonded body which is formed by bonding the first support member, semiconductor region, and second support member. In the chip forming step, the semiconductor region can be cut together with the second support member to form chips.

According to another preferred embodiment of the present invention, the chip forming step can be performed after the thinning step and before the second bonding step. The manufacturing method preferably further comprises, after the first bonding step, a removing step of removing the first support member from the semiconductor region which has been formed into the chips.

According to still another preferred embodiment of the present invention, preferably, the semiconductor substrate has a separation layer under the semiconductor region, and in the thinning step, the semiconductor substrate bonded to the first support member is divided by using the separation layer to remove the second surface-side portion of the semiconductor substrate. The separation layer is preferably formed by anodization or ion implantation. The portion removed in the thinning step can be used again as a material to form the semiconductor substrate.

According to still another preferred embodiment of the present invention, the manufacturing method can further comprise a step of packaging the semiconductor region which has been formed into the chips.

According to still another preferred embodiment of the present invention, the first support member is preferably made of any one material selected from the group consisting of a plastic material, glass, a ceramic material, a metal, and a semiconductor.

According to still another preferred embodiment of the present invention, the second support member is preferably formed of a member having a higher thermal conductivity than that of the semiconductor substrate.

According to still another preferred embodiment of the present invention, in the second bonding step, the thinned semiconductor region and the second support member are preferably bonded through a conductive member (e.g., solder).

According to still another preferred embodiment of the present invention, the semiconductor region is preferably made of any one material selected from the group consisting of silicon, germanium, and a compound semiconductor.

According to still another preferred embodiment of the present invention, the second support member can comprise a light-transmitting member. The term light is not limited to visible light but includes infrared light and ultraviolet light.

According to still another preferred embodiment of the present invention, the thinned semiconductor region and the second support member may be bonded through a light-transmitting member.

According to the second aspect of the present invention, there is provided a semiconductor device which is formed by packaging an integrated circuit chip and a support member bonded to one surface of the integrated circuit chip, wherein the integrated circuit chip and support member have substantially the same size.

According to still another preferred embodiment of the present invention, the support member preferably comprises a member having a higher thermal conductivity than that of a substrate of the integrated circuit chip.

According to still another preferred embodiment of the present invention, the support member may comprise a light-transmitting member. The term light is not limited to visible light but includes infrared light and ultraviolet light.

According to still another preferred embodiment of the present invention, the integrated circuit chip and support member are preferably obtained by cutting both a semiconductor substrate having a plurality of integrated circuit chips and a support member bonded to the semiconductor substrate.

According to the present invention, chip formation which accompanies thinning of the semiconductor region where the integrated circuits are formed can moderate a difficulty in packaging, more specifically, facilitate dicing or die bonding.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described with reference to the accompanying drawings.

As the integration density and operation speed of semiconductor devices increase, heat generated by the semiconductor devices becomes very high. An increase in temperature of a semiconductor device caused by heat generation adversely affects the device characteristics considerably, and an increase in heat radiation performance is accordingly sought for. While the heat radiation performance can be increased by thinning the semiconductor device, if the semiconductor device is merely thinned, the semiconductor device or chip can be damaged during dicing, and it becomes difficult to hold the chip during die bonding.

In view of this, according to this embodiment, a semiconductor layer or semiconductor region where semiconductor devices are formed is supported by the first support member and then thinned to improve the heat radiation performance. The thinned semiconductor layer or semiconductor region is supported by a second support member, and cut or divided to form chips. By cutting or dividing the thinned semiconductor layer or semiconductor region to form chips, damages to the semiconductor layer or semiconductor region are prevented. Furthermore, the heat radiation performance can be improved by employing as the second support member a member having a high heat radiation performance. The first support member may be removed before cutting the semiconductor layer or semiconductor region, or after cutting.

The semiconductor layer or semiconductor region may be cut (divided) while it is supported by only the first support member (i.e., before it is supported by the second support member). In this case, after cutting, before the support member is removed, the second support member can be adhered to the semiconductor layer or semiconductor region which has been formed into chips by cutting.

First Embodiment

The first embodiment of the present invention will be described with reference to FIGS. 1A to 1F.

Figure 1A:
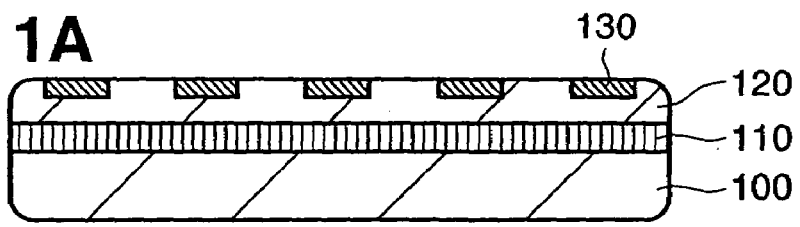
FIGS. 1A to 1F are views for schematically describing a semiconductor chip manufacturing method.

First, in the step shown in FIG. 1A, a separation layer 110 and semiconductor layer (semiconductor region) 120 are formed on a semiconductor substrate 100 serving as a seed substrate. Then, integrated circuits 130 including semiconductor devices are formed in the semiconductor layer 120.

More specifically, a porous layer 110 including two layers having different porosities is formed as a separation layer on the silicon substrate (semiconductor substrate) 100 serving as the seed substrate by an anodizing process. The porous layer 110 including the two layers having the different porosities can be formed by changing conditions (e.g., current conditions) for the anodizing process. When the porous layer 110 including the two layers having the different porosities is formed, the interface between the two layers can be used as a separation interface in a later separating step.

For example, the conditions for the anodizing process can be determined in the following manner.

Semiconductor substrate:
P⁻ substrate, resistivity=16 mΩ·cm
Anodizing process: HF:IPA=42.5:9.2 (wt. %)
Current conditions (first porous layer): 5.12 A, 150 sec
Current conditions (second porous layer): 9.2 A, 60 sec The resistivity and impurities of the semiconductor substrate are not particularly limited, and can be set arbitrarily as far as a porous layer serving as a separation layer can be formed. If epitaxial growth is to be employed in the subsequent step, to form a good epitaxial growth layer (semiconductor layer), it is preferable to employ a P-type substrate having a resistivity of 6 mΩ·cm to 20 mΩ·cm. It is more preferable to employ a P-type substrate having a resistivity of 14 mΩ·cm to 17 mΩ·cm.

The porous layer need not have a two-layer structure, but can have a single layer structure or a multilayer structure with three or more layers.

Preferably, the silicon substrate 100 on which the porous layer 110 serving as the separation layer is formed is oxidized (e.g., at 400° C. for 1 hr) in an oxygen atmosphere to cover the pore walls with a thermal oxide film. Subsequently, an aqueous solution of dilute hydrofluoric acid (HF) is preferably brought into contact with the surface of the porous layer 110 to remove the oxide film on the surface of the porous layer 110 to leave oxide films on the inner walls of the pores. This process is sufficient as far as it can remove only the oxide film on the surface of the porous layer, and can use, e.g., hydrofluoric acid (HF) vapor in place of the aqueous solution of hydrofluoric acid.

Subsequently, the pores in the surface of the porous layer 110 are preferably closed by baking the silicon substrate 100 in a hydrogen containing ambient.

Subsequently, the single-crystal silicon layer (semiconductor layer) 120 is epitaxially grown on the porous layer 110. For example, the single-crystal silicon layer 120 having a thickness of 2 μm can be grown with the following conditions:
  Source gas: $SiH_2Cl_2/H_2$
  Flow rate of gas: 0.5/180 l/min
  Pressure of gas: 80 Torr
  Temperature: 950° C.

The epitaxial growth is not limited to vapor phase growth, but liquid phase growth can also be employed. As the semiconductor layer 120, instead of the silicon layer, another semiconductor layer such as germanium layer, or a compound semiconductor layer such as SiGe layer can be formed.

Subsequently, the integrated circuits 130 such as microprocessors, logic ICs, and memories are formed in the semiconductor layer 120 by lithography. The step of forming the integrated circuits is identical to the step of forming the integrated circuits in a bulk substrate. With the above steps, the substrate schematically shown in FIG. 1A is obtained. The semiconductor layer 120 side surface of the substrate shown in FIG. 1A will be referred to as the first surface, and a surface opposite to the first surface will be referred to as the second surface hereinafter.

Figure 1B:
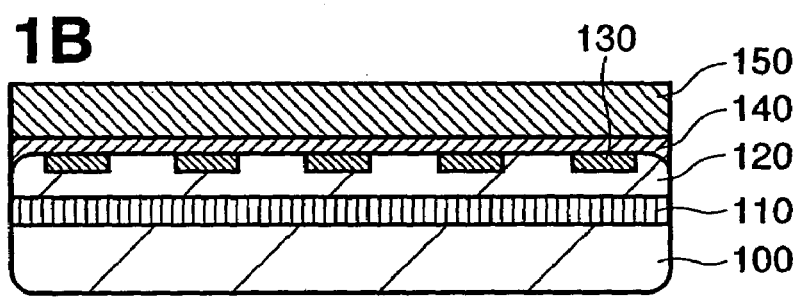

In the step shown in FIG. 1B, the semiconductor substrate (FIG. 1A) in which the integrated circuits 130 are formed in the semiconductor layer 120 is bonded to a first support member 150 such that its semiconductor layer 120 side (first surface side) becomes inside. For this bonding, for example, an adhesive 140 such as epoxy adhesive can be used.

As the first support member 150, for example, a plastic material, glass, a ceramic material, a metal, a semiconductor, or the like can be employed, and can be appropriately selected in accordance with the required adhesion strength, the type of the adhesive that can be used, the strength required for the first support member, and the like. A method with which the adhesion surface will not separate in the latter step before the separation interface in the porous layer does should be employed.

Figure 1C:
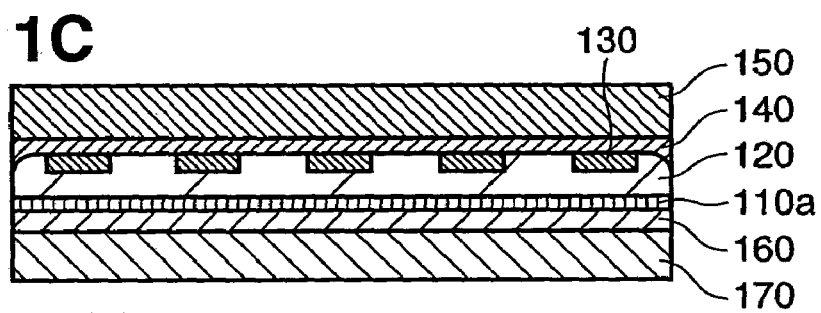

In the step shown in FIG. 1C, the silicon substrate 100 (the second surface side-portion) serving as the seed substrate is separated (removed) from the substrate shown in FIG. 1B at the separation interface (the interface in the porous layer including the two layers having the different porosities) in the porous layer 110 as the boundary (separation interface). A second support member 170 is adhered to the semiconductor layer 120 side of, of the two separate substrates, the substrate which has the semiconductor layer 120.

To separate (remove) the silicon substrate 100, a separation method employing a fluid is suitable. More specifically, a method of blowing a liquid such as water or alcohol or a gas such as air or nitrogen to the separation interface or its vicinity in the porous layer 110 is preferable.

When necessary, a porous layer 110a which is left in the semiconductor layer 120 in which the integrated circuits 130 are formed may be removed. As the method of removing the remaining porous layer 110a, a method which uses a chemical solution (e.g., aqueous hydrogen peroxide, a liquid mixture of nitric acid and hydrofluoric acid) that oxidizes silicon or a mechanical grinding method is suitable.

The method of removing the silicon substrate 100 using the porous layer 110 serving as the separation layer is excellent in that the silicon substrate 100 can be used again as the material substrate in this manufacturing method, that the silicon substrate 100 can be removed within a short period of time, and that damages to the semiconductor layer 120 are small. To use the silicon substrate 100 again, it is processed as required and then subjected to the step which has been described with reference to FIG. 1A.

The second support member 170 is bonded to the semiconductor layer 120 side (second surface side) of, of the two separate substrates, the substrate which has the semiconductor layer 120. Then, a structure including the second support member 170/(remaining porous layer 110a; only when it is not removed)/semiconductor layer 120/adhesive 140/first support member 150 is obtained.

The second support member 170 is preferably a heat conductive member having a high thermal conductivity (e.g., a member having a thermal conductivity higher than that of the semiconductor substrate serving as the seed substrate). In adhesion, e.g., an adhesive 160 having a high thermal conductivity or a solder (conductive member) may be used. It is also suitable to plate the pore walls of the remaining porous layer 110a with copper or the like and adhere the porous layer 110a to a plate having a high thermal conductivity.

A heat sink such as one for an LSI may be used in place of the second support member 170. Also, a heat sink may be bonded to the second support member 170. When a conductive plate having a high thermal conductivity and a heat sink are to be used in combination, the conductive plate having the high thermal conductivity is preferably made of a material that can be bonded to both the semiconductor layer 120 or remaining porous layer 110a and the heat sink (made of e.g., Cu or Al) through an adhesive or solder (conductive member). For example, this material is preferably a metal, particularly copper or gold, which has a higher thermal conductivity than that of a semiconductor material which forms the integrated circuits.

Figure 1D:
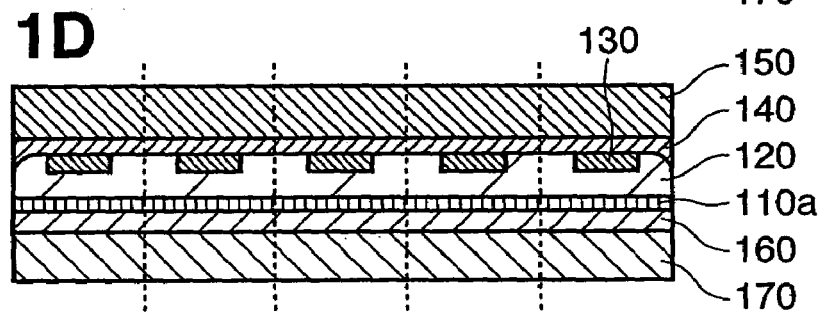
Figure 1E:
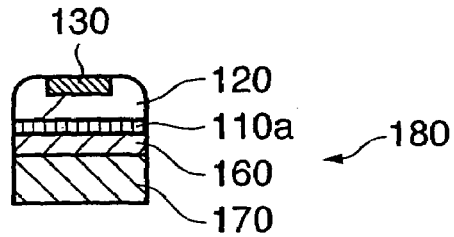

Subsequent to the step shown in FIG. 1C, in the step shown in FIG. 1D, the semiconductor layer 120 supported by the second support member 170 is diced (cut) to obtain integrated circuit chips 180 each of which is schematically shown in FIG. 1E. The semiconductor layer 120 may be cut together with the second support member 170, or together with both the first and second support members 150 and 170. When a plurality of members which are formed into chips (by cutting or separated) in accordance with the chip size of the semiconductor layer 120 are to be used as the second support member 170, when cutting the semiconductor layer 120, only the semiconductor layer 120 may be cut, or only the semiconductor layer 120 and first support member 150 may be cut.

The integrated circuit chip 180 includes the semiconductor layer 120 which is formed into a chip, and the second support member 170 which is formed into a chip having substantially the same size as that of the semiconductor layer 120 which is formed into the chip.

Conventionally, the semiconductor layer has a thickness that only corresponds to approximately the epitaxial growth and is very thin. For this reason, during dicing, the semiconductor layer may be damaged, and it is difficult to hold the chip during die bonding. In view of this, according to this embodiment, prior to dicing, the semiconductor layer 120 is supported by the second support member 170, e.g., a conductive plate having a high thermal conductivity. Thus, the semiconductor layer 120 has a sufficiently high strength against dicing, and the chip can be held easily during die bonding.

Figure 1F:
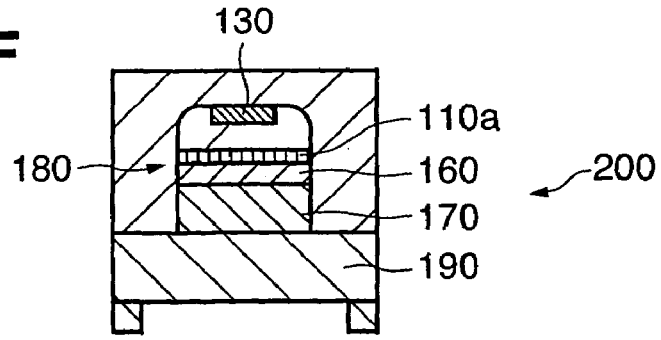

In the step shown in FIG. 1F, the integrated circuit chip 180 is packaged. During packaging, the thermal conductive plate having a high thermal conductivity and serving as the second support member 170 is adhered to a package base 190. Then, the integrated circuit 130 is wire-bonded to the lead frame of the package base 190.

Typically, prior to the packaging, the first support member 150 can be removed from the chip 180 or semiconductor layer 120. The first support member 150 may be removed from the chip 180 or semiconductor layer 120 before or after dicing (cutting) as far as the second support member 170 is already bonded to the semiconductor layer 120. Preferably, the first support member 150 is removed after dicing. With the method of removing the first support member 150 from the chip 180 after dicing, as the adhesion area is small, the first support member 150 can be removed from the chip 180 with a small force.

As the method of removing the first support member 150 from the chip 180 or semiconductor layer 120, a method of dipping the entire chip or substrate in an adhesive removing liquid (organic solvent) is suitable. Alternatively, a method of mechanically grinding the first support member or a method of removing the first support member by using the difference in thermal stress will do.

The integrated circuit chip 180 which is schematically shown in FIG. 1F and obtained with the above steps has a thickness of a fraction of several hundreds the thickness of an integrated circuit chip which uses a conventional bulk silicon substrate, and accordingly has a remarkably excellent heat radiation performance. As the semiconductor layer is formed into chips (divided) while it is supported by the second support member, damages to the semiconductor layer during the process such as dicing can be prevented. Furthermore, when a member having an excellent heat radiation performance is employed as the second support member, the heat radiation performance can be further improved. When the semiconductor layer chip is supported by the second support member chip, the integrated circuit chip can be held easily during die bonding.

In the above embodiment, the second support member is bonded to the semiconductor layer 120, and after that the semiconductor layer 120 is cut. In place of this, the semiconductor layer 120 which is bonded to the first support member 150 may be cut into chips, the second support member 170 may be bonded to the semiconductor layer 120 which forms a chip, and thereafter the first support member 150 may be removed from the semiconductor layer 120 which forms the chip. With this method, the semiconductor layer 120 is cut while it is supported by the first support member 150. Therefore, the damages to be applied to the semiconductor layer 120 during cutting can be decreased. The second support member 170 is bonded to the semiconductor layer 120 before the first support member 150 is removed from the semiconductor layer 120 which forms the chip. Therefore, the semiconductor layer 120 which forms the chip can be protected from an impact or the like. Thus, for example, the semiconductor layer 120 which forms the chip can be held easily during die bonding.

When bonding the second support member 170 to the semiconductor layer 120 which forms the chips, the second support member 170 which is cut into the chip size may be bonded to the chip formed by cutting the semiconductor layer 120. Alternatively, the non-cut second support member 170 may be bonded to the semiconductor layer 120 which forms the chip, and thereafter the second support member 170 may be cut into a chip size.

When forming the semiconductor layer 120 into chips, the first support member 150 may be cut together with the semiconductor layer 120. Alternatively, only the semiconductor layer 120 may be cut without cutting the first support member 150.

Second Embodiment

According to the second embodiment, the method of forming the separation layer of the first embodiment is changed.

Figure 2A:
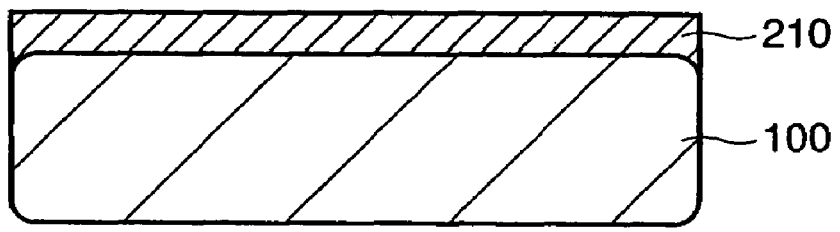
FIGS. 2A to 2C are views for describing another example of a separation layer forming method.
Figure 2B:
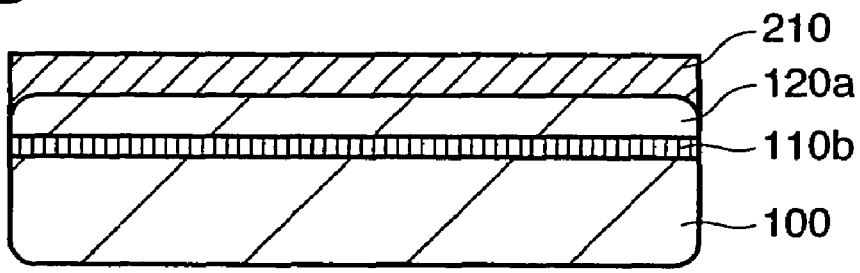

First, in the step shown in FIG. 2A, an insulating layer (e.g., a $SiO_2$ layer) serving as a protection film 210 is formed on a silicon substrate (semiconductor substrate) 100 serving as a seed substrate. In the step shown in FIG. 2B, ions such as hydrogen ions are implanted in the silicon substrate 100 to form an ion-implanted layer serving as a separation layer (ion-implanted layer) 110b in a region at a predetermined depth from the surface of the silicon substrate 100. For example, the implantation amount of the hydrogen ions can be set to the order of $10^{16}$ to $10^{17}$ (atoms/cm$^2$).

Figure 2C:
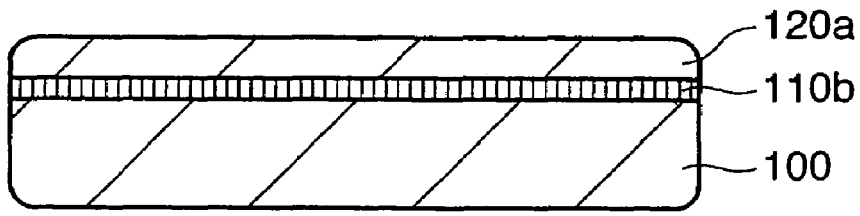

After that, the protection film 210 is removed in the step shown in FIG. 2C. Thus, a substrate which has semiconductor layer 120a on the separation layer 110b an be formed. The substrate obtained in this manner is subjected to the steps shown in FIGS. 1B to 1F to form integrated circuit chips having a thin semiconductor layer in the same manner as in the first embodiment.

The step of forming a protection film, which is performed prior to ion implantation, is not necessary. Alternatively, the separation film may be formed by implanting ions in the seed substrate (silicon substrate) 100 without forming a protection film on it.

Third Embodiment

This embodiment provides an optical card manufacturing method as well as a method of removing a seed substrate without using a separation layer.

First, integrated circuits including, e.g., a light-receiving element and amplification circuit, are formed on a silicon substrate serving as a seed substrate. After that, the first support member is bonded to the silicon substrate such that the integrated circuit side (first surface side) becomes inside.

Subsequently, the silicon substrate is thinned from the lower surface (second surface side) by grinding and abrasion using a grinder to leave a semiconductor layer (semiconductor region) having a predetermined thickness (e.g., 50 μm) as a region that includes integrated circuits.

Subsequently, a light-transmitting substrate (quartz substrate) serving as the second support member is bonded to the integrated circuit side (second surface side) of the obtained substrate. In this case, annealing (e.g., at 400° for 1 hr) is preferably performed to increase the bonding strength.

The light-transmitting substrate is not limited to the quartz substrate. The material of the light-transmitting substrate is not particularly limited as far as it transmits light, and can be, e.g., glass. As the light-transmitting substrate, for example, a substrate which has a higher light transmittance than that of the semiconductor substrate serving as the seed substrate can be employed.

Subsequently, the substrate is diced and wires are connected to it. After that, each diced substrate portion is packaged using a plastic material to obtain a transparent optical card (a card having a light-transmitting portion).

In the first embodiment as well, a card or package which employs a light-transmitting member as the second support member and has a light-transmitting portion can be manufactured.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2004-183961 filed on Jun. 22, 2004, the entire contents of which are hereby incorporated by reference herein.

What is claimed is:

1. An integrated circuit chip manufacturing method comprising:
   a first bonding step of bonding a first support member to a first surface of a semiconductor substrate which has the first surface and a second surface and has a semiconductor region including an integrated circuit on a first surface side thereof;
   a thinning step of thinning the semiconductor substrate, in a state that the semiconductor substrate is supported by the first support member bonded to the semiconductor substrate, by removing a second surface-side portion of the semiconductor substrate bonded to the first support member such that the semiconductor region is left;
   a second bonding step of bonding a second support member to the second surface side of the thinned semiconductor substrate; and then
   a chip forming step of forming chips by cutting the semiconductor region in a state that the semiconductor region is supported by the second support member bonded to the thinned semiconductor substrates,
   wherein, in the chip forming step, the semiconductor region is cut together with at least one of the first and second support members to form chips.

2. The method according to claim 1, further comprising, after the chip forming step, a removing step of removing the first support member from the semiconductor region which has been formed into the chips.

3. The method according to claim 1, further including, after the second bonding step and before the chip forming step, a step of removing the first support member from a bonded body which is formed by bonding the first support member, semiconductor region, and second support member.

4. The method according to claim 3, wherein in the chip forming step, the semiconductor region is cut together with the second support member to form chips.

5. The method according to claim 1, wherein the chip forming step is performed after the thinning step and before the second bonding step.

6. The method according to claim 5, further comprising, after the first bonding step, a removing step of removing the first support member from the semiconductor region which has been formed into the chips.

7. The method according to claim 1, wherein
   the semiconductor substrate has a separation layer under the semiconductor region, and
   in the thinning step, the semiconductor substrate bonded to the first support member is divided by using the separation layer to remove the second surface-side portion of the semiconductor substrate.

8. The method according to claim 7, wherein the separation layer is formed by anodization or ion implantation.

9. The method according to claim 7, wherein the portion removed in the thinning step is used again as a material to form the semiconductor substrate.

10. The method according to claim 1, further comprising a step of packaging the semiconductor region which has been formed into the chips.

11. The method according to claim 1, wherein the first support member is made of any one material selected from the group consisting of a plastic material, glass, a ceramic material, a metal, and a semiconductor.

12. The method according to claim 1, wherein the second support member is formed of a member having a higher thermal conductivity than that of the semiconductor substrate.

13. The method according to claim 1, wherein in the second bonding step, the thinned semiconductor region and the second support member are bonded through a conductive member.

14. The method according to claim 1, wherein the semiconductor region is made of any one material selected from the group consisting of silicon, germanium, and a compound semiconductor.

15. The method according to claim 1, wherein the second support member comprises a light-transmitting member.

16. The method according to claim 1, wherein in the second bonding step, the thinned semiconductor region and the second support member are bonded through a light-transmitting member.

* * * * *